(12) United States Patent
Iesaka

(10) Patent No.: US 7,247,830 B2
(45) Date of Patent: Jul. 24, 2007

(54) OUTPUT AMPLIFIER FOR SOLID-STATE IMAGING DEVICE

(75) Inventor: Mamoru Iesaka, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/444,498

(22) Filed: Jun. 1, 2006

(65) Prior Publication Data

US 2006/0278813 A1    Dec. 14, 2006

(30) Foreign Application Priority Data

Jun. 2, 2005    (JP)    ............................ 2005-162662

(51) Int. Cl.
*H01L 31/113* (2006.01)
*H04N 3/14* (2006.01)
*H03F 3/16* (2006.01)

(52) U.S. Cl. .............................. 250/208.1; 250/214 A; 348/300; 330/277

(58) Field of Classification Search ............. 250/208.1, 250/214 A; 348/294, 311, 300; 330/277
See application file for complete search history.

(56) References Cited

U.S. PATENT DOCUMENTS

| | | | | |
|---|---|---|---|---|
| 5,287,393 A | * | 2/1994 | Miwada ........................ 377/60 |
| 5,825,249 A | * | 10/1998 | Nakano ........................ 330/277 |
| 7,088,393 B1 | * | 8/2006 | Park ............................ 348/294 |
| 2002/0063790 A1 | * | 5/2002 | Takahashi .................... 348/311 |
| 2003/0011698 A1 | * | 1/2003 | Iesaka ......................... 348/324 |
| 2005/0285957 A1 | * | 12/2005 | Mutoh et al. ............... 348/300 |

FOREIGN PATENT DOCUMENTS

JP    2986752 B2    10/1999

* cited by examiner

*Primary Examiner*—John R. Lee
(74) *Attorney, Agent, or Firm*—Birch, Stewart, Kolasch & Birch, LLP

(57) ABSTRACT

An output amplifier for a solid-state imaging device is provided and includes: a floating diffusion that stores a signal charge; and at least three source follower circuits that output a signal in accordance with a change of a potential on the floating diffusion, the at least three source follower circuits being sequentially connected in decreasing order of drain voltage from a first circuit of the at least three source follower circuits to a last circuit of the at least three source follower circuits.

2 Claims, 1 Drawing Sheet

OUTPUT AMPLIFIER FOR SOLID-STATE IMAGING DEVICE

FIELD OF THE INVENTION

The invention relates to an output amplifier, for a solid-state imaging device, which has a floating diffusion storing signal charges and a source follower circuit outputting a signal in accordance with a change of the potential on the floating diffusion.

BACKGROUND OF THE INVENTION

The CCD solid-state imaging device, which transfers signal charges from the photoelectric converter elements by a CCD transfer section, has a plurality of vertical transfer sections that transfer vertically the signal charges read out from the photoelectric converter elements arranged two-dimensionally in a matrix form, a horizontal transfer section that transfers horizontally the signal charges in an amount of one line transferred from the vertical transfer sections, and an output amplifier that converts the signal charges transferred by the horizontal transfer section into electric signal and output it.

The output amplifier generally includes a floating diffusion (hereinafter referred to as an FD) storing the signal charges transferred from the horizontal transfer section, and two source follower circuits connected in multiple stages and outputting a signal in accordance with a change in the potential on the FD (see Japanese Patent No. 2,986,752, for example). Each of the source follower circuits includes an enhancement drive transistor and a depression load transistor. In an effort to reduce the consumption power on the output amplifier configured as above, it is a practice in the related art to provide the drive transistor in the last-stage source follower circuit with a drain voltage sufficiently lower than the drain voltage of the drive transistor of the first-stage source follower circuit. Such a configuration is important particularly for a solid-state imaging device to mount on a cellular phone or the like because of the requirement of reduced power consumption.

In the output amplifier configured to realize reduced power consumption as above, because the drive transistor of the last-stage source follower circuit has a drain voltage sufficiently lower than that of the drive transistor of the first-stage source follower circuit, the drive transistor of the last-stage source follower circuit must be made as a transistor of a high enhancement type. Such a high-enhancement transistor can be realized by increasing the thickness of a gate oxide film (silicon dioxide film) of the transistor or raising the concentration of a P-type impurity, such as boron, to implant to the gate channel. However, making a transistor high in enhancement results in an increase in the gate (channel)-to-drain voltage of the transistor. The gate(channel)-to-drain voltage, if increased, reduces the transistor's gate modulation factor due to the short-channel effect. This results in a great gain reduction in the output amplifier overall.

SUMMARY OF THE INVENTION

An object of an illustrative, non-limiting embodiment of the invention is to provide an output amplifier for a solid-state imaging device, which can be reduced in consumption power without encountering a gain reduction.

An output amplifier for a solid-state imaging device according to an exemplary embodiment of the invention includes: a floating diffusion storing a signal charge; and at least three source follower circuits outputting a signal in accordance with a change of a potential on the floating diffusion. The at least three source follower circuits is configured connected in multiple stages, and drain voltages in respective stages become lower from a first stage toward a last stage. (That is, the at least three source follower circuits is sequentially connected in decreasing order of drain voltage from a first circuit of the at least three source follower circuits to a last circuit of the at least three source follower circuits.)

This structure allows for reducing the consumption power without encountering a gain reduction.

An exemplary embodiment of the invention can provide an output amplifier for a solid-state image, which can reduce the consumption power without encountering a gain reduction.

DETAILED DESCRIPTION OF THE INVENTION

Exemplary embodiments of the invention will now be explained below with reference to the drawings.

Figure 1:
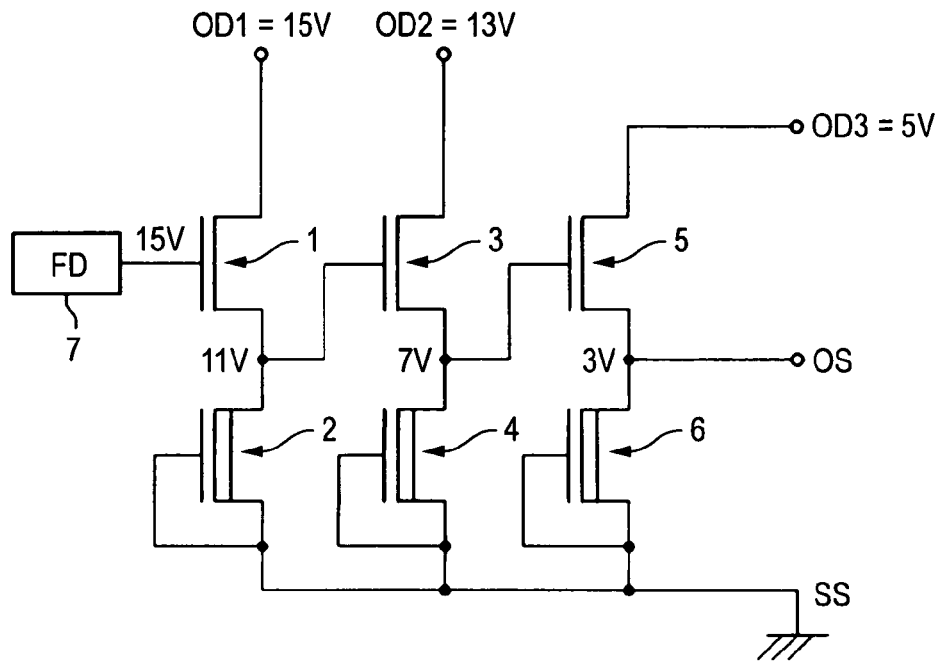
FIG. 1 is a circuit diagram showing a schematic configuration of an output amplifier for a solid-state imaging device, for explaining an exemplary embodiment of the invention.

FIG. 1 is a circuit diagram showing a schematic configuration of an output amplifier for a solid-state imaging device, which is to explain an exemplary embodiment of the invention.

An output amplifier for a solid-state imaging device, shown in FIG. 1, includes an FD 7 that stores signal charges transferred from a horizontal transfer section included in a CCD solid-state imaging device and three source follower circuits that are connected in multiple stages and for detecting a change in the potential on the FD 7 and outputting a signal in accordance therewith.

The source follower circuit, in the first stage (the first circuit), includes an enhancement drive transistor 1 and a depression load transistor 2. The drive transistor 1 has a gate connected to the FD 7 and a source connected to a drain of the load transistor 2. The load transistor 2 at its gate and source is grounded.

The source follower circuit, in the second stage (the second circuit), includes an enhancement drive transistor 3 and a depression load transistor 4. The drive transistor 3 has a gate connected to between a source of the drive transistor 1 and a drain of the load transistor 2, and a source connected to a drain of a load transistor 4. The load transistor 4 at its gate and source is grounded.

The source follower circuit, in the third stage (the third circuit or the final circuit), includes an enhancement drive transistor 5 and a depression load transistor 6. The drive transistor 5 has a gate connected to between a source of the drive transistor 3 and a drain of the load transistor 4, and a source connected to a drain of a load transistor 6. The load transistor 6 at its gate and source is grounded.

In the solid-state-imager output amplifier thus configured, the first to third source follower circuits detect a change of the potential on the FD 7 and output a signal in accordance with the change through a terminal OS.

In order to achieve the reduction of consumption power, this embodiment provides, for example, 15 V, to the drain voltage OD1 of the drive transistor 1, i.e. the input drain voltage to the first-stage source follower circuit and, for example, 5 V sufficiently smaller than the drain voltage OD1, to the drain voltage OD3 of the drive transistor 5, i.e. the input drain voltage to the final-stage source follower circuit. The drain voltage OD2 of the drive transistor 3, i.e. the input drain voltage to the second source follower circuit, is provided a value (e.g. 13 V) smaller than the input drain voltage OD1 to the first-stage source follower circuit but greater than the input drain voltage OD3 to the final-stage source follower circuit.

This makes it possible to reduce the gate-to-drain voltage of the drive transistor 3 as well as the gate-to-drain voltage of the drive transistor 5. Hence, the short-channel effect can be alleviated for the drive transistors 3 and 5. For this reason, the drive transistors 3 and 5 can be prevented from lowering in their gate modulation factors, thus preventing against the lowering in the gain of the output amplifier overall.

As described above, according to the output amplifier for a solid-state imaging device shown in FIG. 1, the drive transistors 3 and 5 can be configured smaller in short-channel effect, thus preventing against the reduction in the gain. Because the input drain voltage OD3 to the last-stage source follower circuit is provided sufficiently low, the reduction in power consumption can be achieved.

In case the drive transistors 3 and 5 respectively have great gate-to-drain voltages, the electric field increases at and around the drain thereof, resulting in an occurrence of hot electrons responsible for image quality deterioration and amplifier-characteristic deterioration over a long term. However, the embodiment can prevent such image quality deterioration and amplifier-characteristic deterioration over a long term.

Figure 2:
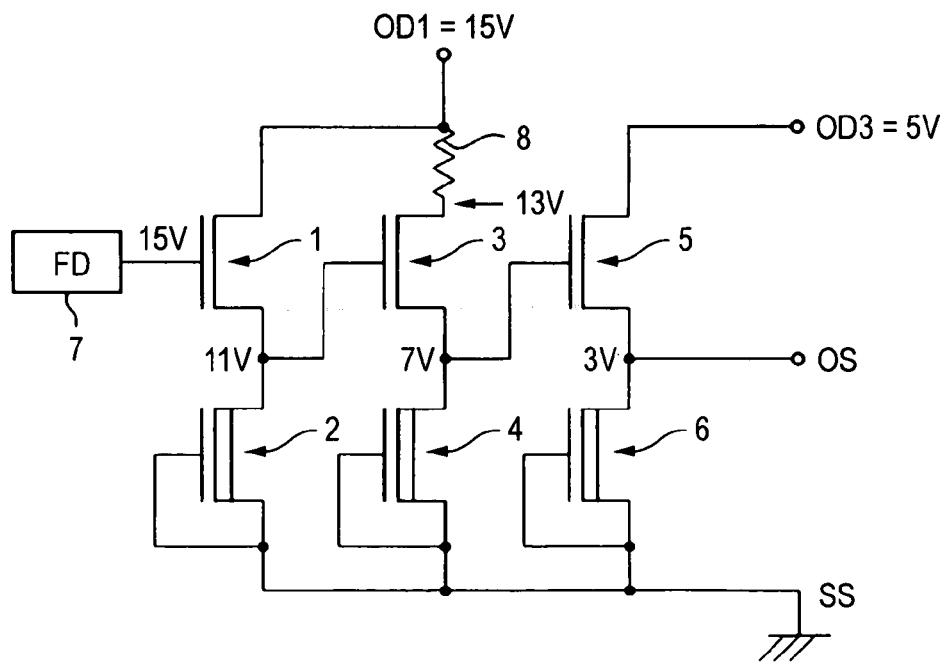
FIG. 2 is a circuit diagram showing a schematic configuration of an output amplifier for a solid-state imaging device, for explaining another exemplary embodiment of the invention.

Incidentally, in the explanation, a drain voltage OD2 of 13 V was directly inputted to the drain of the drive transistor 3. Alternatively, as shown in FIG. 2, the drive transistor 3 at its drain may be connected with one end of a resistance 8, to apply a voltage of 15 V equal to the drain voltage OD1 to the other end of the resistance 8 so that the drain voltage OD1 can be dropped from 15 V to 13 V by the resistance 8 to thereby input a drain voltage of 13 V to the drain of the drive transistor 3.

The explanation was based on the example the three source follower circuits are connected in multiple stages. Alternatively, the effect can be similarly obtained where four or more source follower circuits are connected in multiple stages. In this case, it is satisfactory to provide the drive transistors of the source follower circuits connected multi-stage respectively with such drain voltages that are lower in the direction of from the first stage toward the last stage.

It will be apparent to those skilled in the art that various modifications and variations can be made to the described embodiments of the present invention without departing from the spirit or scope of the invention. Thus, it is intended that the present invention cover all modifications and variations of this consistent with the scope of the appended claims and their equivalents.

This application is based on Japanese Patent Application No. JP2005-162662, filed on June 2, the contents of which is incorporated herein by reference.

What is claimed is:

1. An output amplifier for a solid-state imaging device, comprising:

a floating diffusion that stores a signal charge; and at least three source follower circuits that output a signal in accordance with a change of a potential on the floating diffusion, the at least three source follower circuits being sequentially connected in decreasing order of drain voltage from a first circuit of the at least three source follower circuits to a last circuit of the at least three source follower circuits, wherein each source follower circuit has an enhancement drive transistor and a depression load transistor with the source of the enhancement drive transistor connected to the drain of the depression load transistor, a gate of the enhancement drive transistor of the first source follower circuit of the sequentially connected at least three source follower circuits is connected to the floating diffusion, the gate of each enhancement drive transistor of each subsequent source follower circuit of the sequentially connected at least three source follower circuits is connected to the source/drain connection between the enhancement drive transistor and the depression load transistor of the prior source follower circuit of the sequentially connected at least three source follower circuits, and the drain voltage of the enhancement drive transistor of any subsequent source follower circuit of the sequentially connected at least three source follower circuits is less than the drain voltage of any prior source follower circuit of the sequentially connected at least three source follower circuits.

2. The output amplifier according to claim 1, wherein at least one of the at least three source follower circuits comprises a resistance connected with a drain of the enhancement drive transistor thereof.

\* \* \* \* \*